United States Patent
Bai

(10) Patent No.: US 11,289,673 B2
(45) Date of Patent: Mar. 29, 2022

(54) DISPLAY PANEL HAVING BRAGG MIRROR AND MANUFACTURING METHOD OF SAME

(71) Applicant: WUHAN CHINA STAR OPTOELECTRONICS SEMICONDUCTOR DISPLAY TECHNOLOGY CO., LTD., Hubei (CN)

(72) Inventor: Dan Bai, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 143 days.

(21) Appl. No.: 16/631,451

(22) PCT Filed: Aug. 21, 2019

(86) PCT No.: PCT/CN2019/101678
§ 371 (c)(1),
(2) Date: Jan. 16, 2020

(87) PCT Pub. No.: WO2021/022587
PCT Pub. Date: Feb. 11, 2021

(65) Prior Publication Data
US 2021/0043865 A1    Feb. 11, 2021

(30) Foreign Application Priority Data

Aug. 6, 2019  (CN) .......................... 201910719568.1

(51) Int. Cl.
*H01L 27/15* (2006.01)
*H01L 51/52* (2006.01)
*H01L 51/56* (2006.01)

(52) U.S. Cl.
CPC ...... *H01L 51/5218* (2013.01); *H01L 51/5221* (2013.01); *H01L 51/5265* (2013.01); *H01L 51/5275* (2013.01); *H01L 51/56* (2013.01)

(58) Field of Classification Search
CPC ............. H01L 51/5218; H01L 51/5221; H01L 51/5265; H01L 51/5275
See application file for complete search history.

(56) References Cited

U.S. PATENT DOCUMENTS

2003/0197466 A1* 10/2003 Yamazaki ........... H01L 51/5271
313/504
2015/0008419 A1† 1/2015 Li
(Continued)

FOREIGN PATENT DOCUMENTS

| CN | 102983285 A | 3/2013 |
| CN | 103165648 A | 6/2013 |

(Continued)

*Primary Examiner* — Phuc T Dang
(74) *Attorney, Agent, or Firm* — Mark M. Friedman

(57) ABSTRACT

The present application provides a display panel and a manufacturing of the display panel, the display panel includes a substrate, a thin film transistor layer, and a light emitting layer successively laminated and formed. The light emitting layer includes an anode layer, a light emitting portion, and a cathode layer successively laminated and formed. The anode layer includes a laminated structure, the laminated structure includes at least one first sub layer and at least one second sub layer alternant formed on the thin film transistor layer, the laminated structure is used to form a Bragg reflection, thereby improving display quality of the display panel.

20 Claims, 3 Drawing Sheets

(56) References Cited

U.S. PATENT DOCUMENTS

2017/0125748 A1† 5/2017 Choi et al.
2018/0083085 A1* 3/2018 Moon ................. H01L 27/3276
2018/0123073 A1† 5/2018 Bang et al.
2019/0123121 A1* 4/2019 Liu ..................... H01L 27/3246

FOREIGN PATENT DOCUMENTS

| CN | 104272487 A | | 1/2015 |
|---|---|---|---|
| CN | 108022955 A | † | 5/2018 |
| JP | 2018014346 A | | 1/2018 |

\* cited by examiner
† cited by third party

DISPLAY PANEL HAVING BRAGG MIRROR AND MANUFACTURING METHOD OF SAME

BACKGROUND OF INVENTION

Field of Invention

The present application relates to a display field, and particularly to a display panel and a manufacturing method of the display panel.

Description of Prior Art

Compared with liquid crystal display technology, organic light emitting diode display technology has advantages of high reaction speed, high contrast, wide viewing angles, etc. In prior art, a silver layer is usually disposed in an anode layer as a reflective layer, and the reflectance is greater than 90%. However, the silver layer has a strong blue light absorption resulting in a low reflectance of blue light, thereby affecting display quality. Therefore, how to improve display quality of the display panel is an urgent problem to be solved.

SUMMARY OF INVENTION

The present application provides a display panel and a manufacturing method of the display panel to improve the display quality of the display panel.

The present application provides a display panel including:

a substrate;

a thin film transistor layer, wherein the thin film transistor layer is formed on the substrate; and a light emitting layer, wherein the light emitting layer is formed on the thin film transistor layer, the light emitting layer comprises:

an anode layer, wherein the anode layer comprises a laminated structure and an electrode layer, the laminated structure is formed on the thin film transistor layer, the laminated structure comprises at least one first sub layer and at least one second sub layer, the first sub layer and the second sub layer are alternant formed on the thin film transistor, the electrode layer is formed on the laminated structure, the electrode layer are electrically connected to the thin film transistor layer;

a light emitting portion, wherein the light emitting portion is formed on and electrically connected to the anode layer; and a cathode layer, wherein the cathode layer is formed on and electrically connected to the light emitting portion.

In the display panel of the present application, a refractive index of the first sub layer is different from a refractive index of the second sub layer.

In the display panel of the present application, a material of the first sub layer is Si, SiC, $Si_3N_4$, $TiO_2$, $Al_2O_3$, BeO, $CaF_2$, ZnSe, $MgF_2$, LiF, MgO, or combinations thereof.

In the display panel of the present application, a material of the second sub layer is Si, SiC, $Si_3N_4$, $TiO_2$, $Al_2O_3$, BeO, $CaF_2$, ZnSe, $MgF_2$, LiF, MgO, or combinations thereof.

In the display panel of the present application, a material of the first sub layer is $SiN_x$, a material of the second sub layer is $SiO_x$.

In the display panel of the present application, a thickness of the first sub layer is the same as a thickness of the second sub layer.

In the display panel of the present application, a thickness of the first sub layer is 50-250 nm, and a thickness of the second sub layer is 50-250 nm.

In the display panel of the present application, a thickness of the first sub layer is 50-250 nm, and a thickness of the second sub layer is 50-250 nm.

In the display panel of the present application, a layer number of the laminated structure ranges from 1 to 20.

In the display panel of the present application, a thickness of the laminated structure is less than 1000 nm.

The present application provides a manufacturing method of a display panel including:

providing a substrate;

forming a thin film transistor layer on the substrate;

forming a light emitting layer on the thin film transistor layer, wherein the light emitting layer comprises an anode layer, a light emitting portion, and a cathode layer successively laminated and formed on the thin film transistor layer, the step of forming a light emitting layer on the thin film transistor layer comprises:

forming the anode layer on the thin film transistor layer, wherein the anode layer comprises a laminated structure and an electrode layer, the laminated structure is formed on the thin film transistor layer, the laminated structure comprises at least one first sub layer and at least one second sub layer, the first sub layer and the second sub layer are alternant formed on the thin film transistor, the electrode layer is formed on the laminated structure, the electrode layer are electrically connected to the thin film transistor layer;

forming the light emitting portion on the anode layer; and forming the cathode layer on the light emitting portion.

In the manufacturing method of the present application, a refractive index of the first sub layer is different from a refractive index of the second sub layer.

In the manufacturing method of the present application, a material of the first sub layer is Si, SiC, $Si_3N_4$, $TiO_2$, $Al_2O_3$, BeO, $CaF_2$, ZnSe, $MgF_2$, LiF, MgO, or combinations thereof.

In the manufacturing method of the present application, a material of the second sub layer is Si, SiC, $Si_3N_4$, $TiO_2$, $Al_2O_3$, BeO, $CaF_2$, ZnSe, $MgF_2$, LiF, MgO, or combinations thereof.

In the manufacturing method of the present application, a material of the first sub layer is $SiN_x$, a material of the second sub layer is $SiO_x$.

In the manufacturing method of the present application, a thickness of the first sub layer is the same as a thickness of the second sub layer.

In the manufacturing method of the present application, a thickness of the first sub layer is 50-250 nm, and a thickness of the second sub layer is 50-250 nm.

In the manufacturing method of the present application, a thickness of the first sub layer is 50-250 nm, and a thickness of the second sub layer is 50-250 nm.

In the manufacturing method of the present application, a layer number of the laminated structure ranges from 1 to 20.

In the manufacturing method of the present application, a thickness of the laminated structure is less than 1000 nm.

The benefit is: the present application provides a display panel and a manufacturing of the display panel, the display panel includes a substrate, a thin film transistor layer, and a light emitting layer. The thin film transistor layer is formed on the substrate, the light emitting layer is formed on the thin film transistor layer, the light emitting layer includes an anode layer, a light emitting portion, and a cathode layer. The anode layer includes a laminated structure and an electrode layer, the laminated structure is formed on the thin film transistor layer, the laminated structure includes at least one first sub layer and at least one second sub layer, the first sub layer and the second sub layer are alternant formed on the thin film transistor, the electrode layer is formed on the laminated structure, the electrode layer are electrically connected to the thin film transistor layer, the light emitting portion is formed on and electrically connected to the anode layer, the cathode layer is formed on and electrically connected to the light emitting portion, according to the first sub layer and the second sub layer alternant formed on the thin film transistor, two refractive index materials are repeatedly superposed to form a Bragg mirror, so that the absorption of light in different wavelength bands is very low, which solves a problem of a strong absorption and a weak reflection of a reflection layer on the blue light band, thereby improving the refractive index of the reflective layer and improving display quality of the display panel.

DETAILED DESCRIPTION OF PREFERRED EMBODIMENTS

Figure 1:
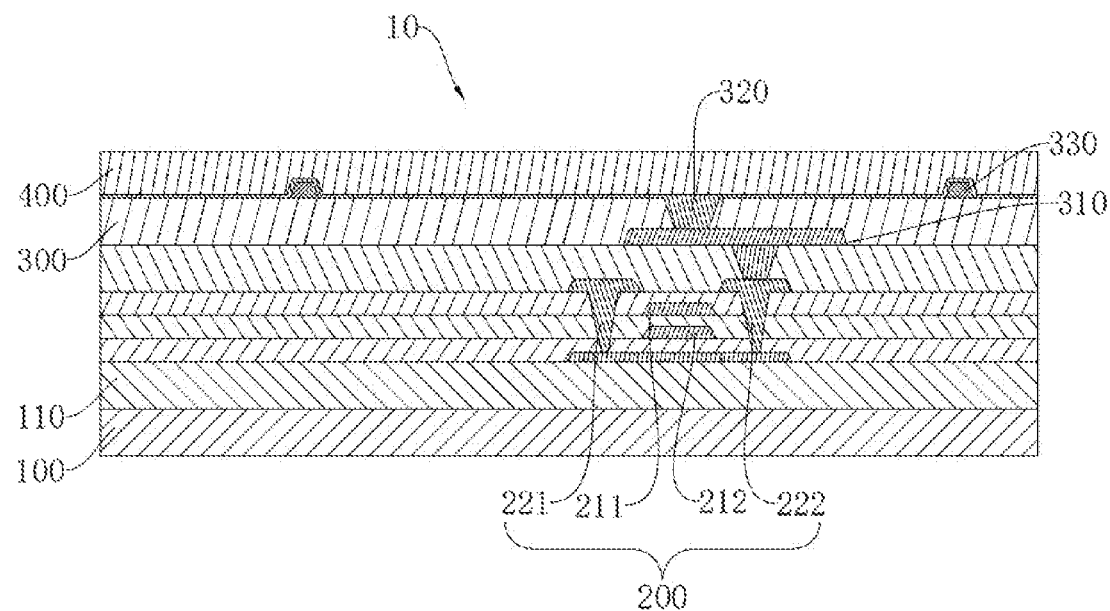
FIG. 1 is a first structural sectional view of a display panel of the present disclosure.

Referring to FIG. 1, the present application provides a display panel 10. The display panel 10 includes a substrate 100, a thin film transistor layer 200, and a light emitting layer 300. The thin film transistor layer 200 is formed on the substrate 100. The light emitting layer 300 is formed on the thin film transistor layer 200.

The substrate 100 can be a transparent alkali-free glass substrate or a quartz substrate, or other transparent substrates with a certain hardness.

The thin film transistor layer 200 includes a first gate electrode 211, a second gate electrode 212, a source electrode 221, and a drain electrode 222.

Figure 2:
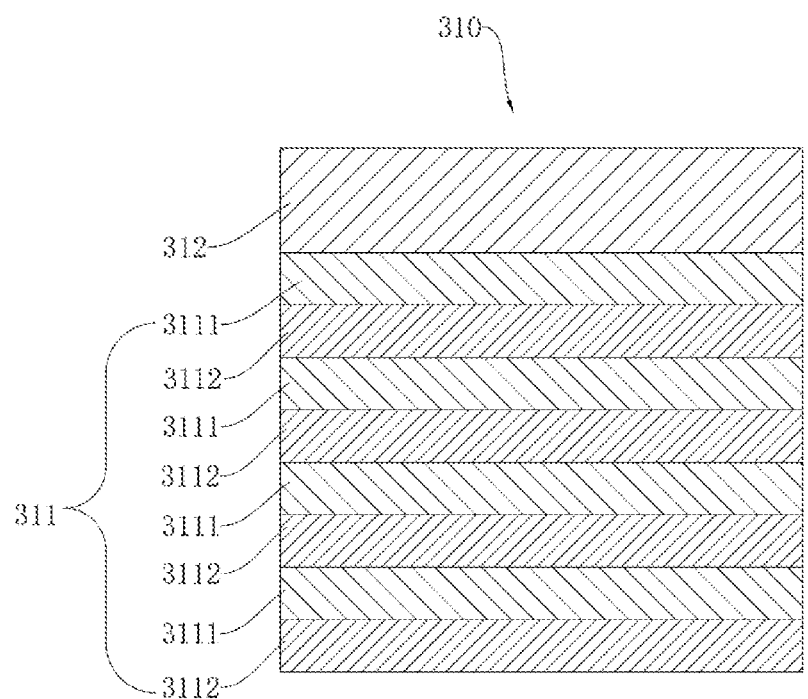
FIG. 2 is a structural sectional view of an anode layer of the display panel of the present disclosure.
Figure 3:
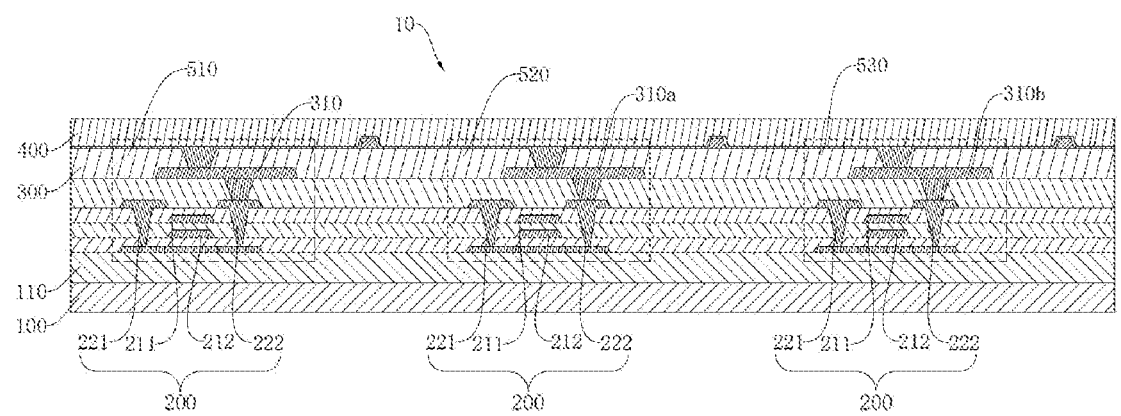
FIG. 3 is a second structural sectional view of the display panel of the present disclosure.
Figure 4:
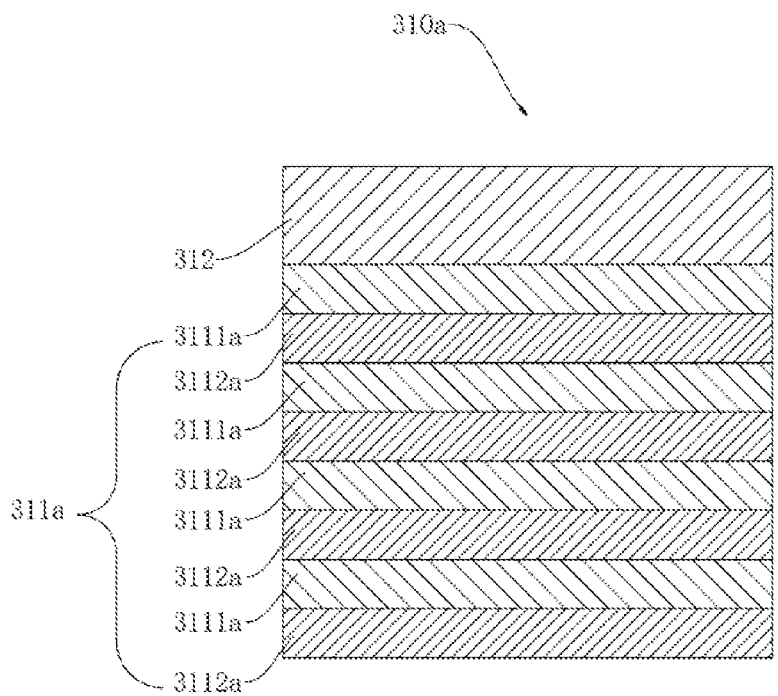
FIG. 4 is a structural sectional view of an anode layer of a red pixel of the display panel of the present disclosure.
Figure 5:
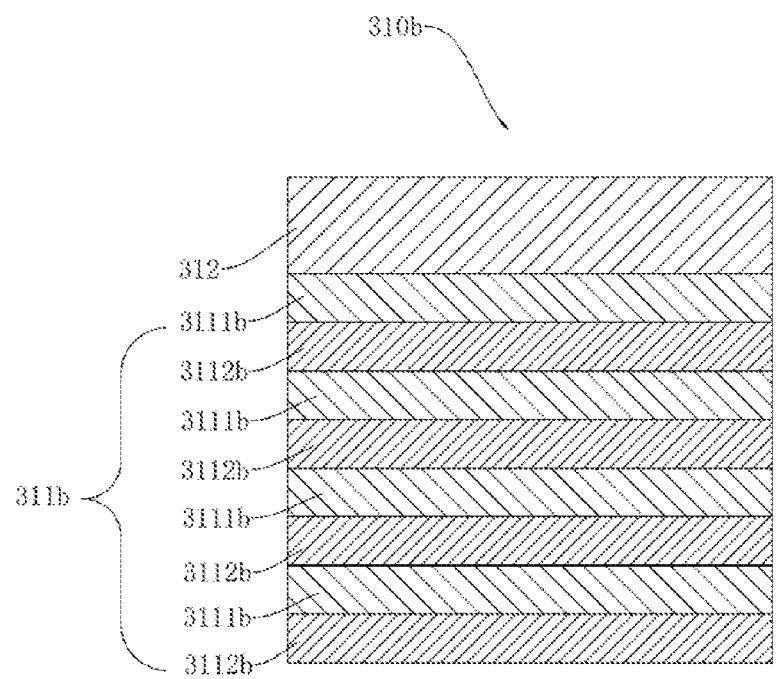
FIG. 5 is a structural sectional view of an anode layer of a green pixel of the display panel of the present disclosure.

Referring to FIG. 1 and FIG. 2, the light emitting layer 300 includes an anode layer 310, a light emitting portion 320, and a cathode layer 330. The anode layer 310 includes a laminated structure 311 and an electrode layer 312. The laminated structure 311 is formed on the thin film transistor layer 200. The laminated structure 311 includes at least one first sub layer 3111 and at least one second sub layer 3112. The first sub layer 3111 and the second sub layer 3112 are alternant formed on the thin film transistor layer 200. The electrode layer 312 is formed on the laminated structure 311. The electrode layer 312 is electrically connected to the thin film transistor layer 200. The light emitting portion 320 is formed on and electrically connected to the anode layer 310. The cathode layer 330 is formed on and electrically connected to the light emitting portion 320. In prior art, an anode structure is a structure of a silver layer sandwiched between two indium tin oxide layers (ITO/Ag/ITO), but silver has a strong absorption in blue light band. However, in the present application, according to the first sub layer and the second sub layer alternant formed on the thin film transistor, so that the absorption of light in different wavelength bands is very low, which solves a problem of a strong absorption and a weak reflection of a reflection layer in the blue light band, thereby improving the refractive index of the reflective layer and improving display quality of the display panel.

In one embodiment, a reflective index of the first sub layer 3111 is different from a reflective index of the second sub layer 3112. Material of the first sub layer can be SiN. Material of the second sub layer can be $SiO_x$. A reflective index of $SiN_x$ is 1.87. A reflective index of $SiO_x$ is 1.45. In some embodiments, materials of the first sub layer 3111 and the second sub layer 3112 can be one or a group selected from Si, SiC, $Si_3N_4$, $TiO_2$, $Al_2O_3$, BeO, $CaF_2$, ZnSe, $MgF_2$, LiF, and MgO. In the present application, two kinds of materials with different refractive indexes are overlapped to form a Bragg mirror, and reflected light will have a very obvious variation of peaks and valleys, so that a reflectivity index of the laminated structure is as high as 99% or more, and the display quality is improved.

In some embodiments, in order to avoid an influence of a manufacturing process caused by an excessive thickness of film layer, a thickness of the laminated structure 311 can be less than 1000 nm, the number of layers can range from 1 to 20, the first sub layer 3111 and the second sub layer 3112 are alternately arranged, and a thicknesses of the first sub layer 3111 and the second sub layer 3112 can be the same. In some embodiments, the thickness of the first sub layer 3111 can range from 50 nm to 250 nm, and the second sub layer 3112 can range from 50 nm to 250 nm, and each layer has a thickness of one quarter of a blue light wavelength, which can improve the reflectance index of the blue light.

Referring to FIGS. 1-5, in another embodiment, the display panel 10 includes a plurality of blue sub pixel 510, a plurality of red sub pixel 520, and a plurality of green sub pixel 530. The blue sub pixel 510 includes a first gate electrode 211, a second gate electrode 212, a source electrode 221, a drain electrode 222, and an anode layer 310. The anode layer 310 includes a laminated structure 311 and an electrode layer 312. The laminated structure 311 includes a first sub layer 3111 and a second sub layer 3112. Both of a thickness of the first sub layer 3111 and a thickness of the second sub layer 3112 are one quarter of a blue light wavelength. The red sub pixel 520 includes a first gate electrode 211, a second gate electrode 212, a source electrode 221, a drain electrode 222, and an anode layer 310a. The anode layer 310a includes a laminated structure 311a and an electrode layer 312. The laminated structure 311a includes a first sub layer 3111a and a second sub layer 3112a. A thickness of the first sub layer 3111a is one quarter of a red light wavelength. A thickness of the second sub layer 3112a is one quarter of a red light wavelength. The green sub pixel 530 includes a first gate electrode 211, a second gate electrode 212, a source electrode 221, a drain electrode 222, and an anode layer 310b. The anode layer 310b includes a laminated structure 311b and an electrode layer 312b. The laminated structure 311b includes a first sub layer 3111b and a second sub layer 3112b. A thickness of the first sub layer 3111b is one quarter of a green light wavelength. A thickness of the second sub layer 3112b is one quarter of a green light wavelength. Though adjusting the thicknesses of the laminated films, a lowest light absorption in different light bands is achieved, thereby improving a reflective index and improving the display quality of the display panel.

Figure 6:
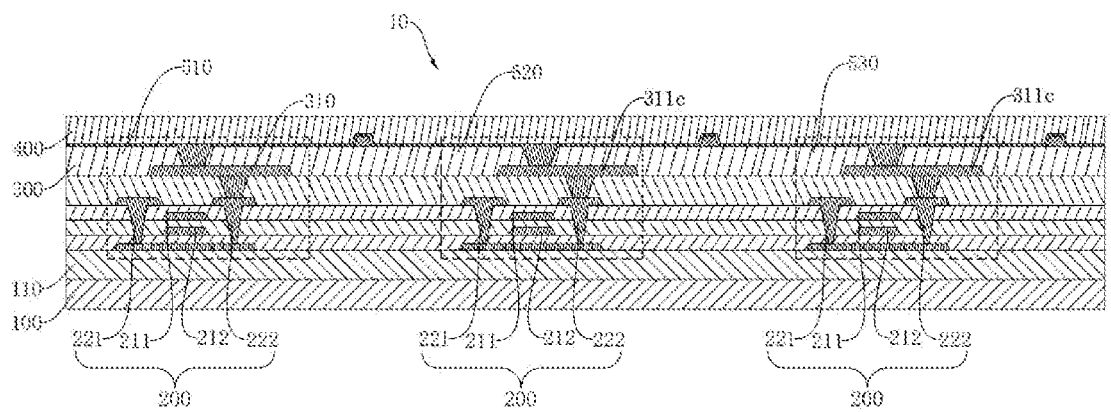
FIG. 6 is a third structural sectional view of the display panel of the present disclosure.

Referring to FIGS. 1 and 6, in some embodiments, the blue sub pixel 510 includes a first gate electrode 211, a second gate electrode 212, a source electrode 221, a drain electrode 222, and an anode layer 310. The anode layer 310 includes a laminated structure 311 and an electrode layer 312. The laminated structure 311 includes a first sub layer 3111 and a second sub layer 3112. Both of a thickness of the first sub layer 3111 and a thickness of the second sub layer 3112 are one quarter of a blue light wavelength. The red sub pixel 520 includes a first gate electrode 211, a second gate electrode 212, a source electrode 221, a drain electrode 222, and an anode layer 311c. The anode layer 311c can be a structure of a silver layer sandwiched between two indium tin oxide layers(ITO/Ag/ITO). The green sub pixel 530 includes a first gate electrode 211, a second gate electrode 212, a source electrode 221, a drain electrode 222, and an anode layer 311c. The anode layer 311c can be a structure of a silver layer sandwiched between two indium tin oxide layers(ITO/Ag/ITO). A manufacturing process of the laminated structure can be absented in a manufacturing process of the red sub pixel and the green sub pixel to make the manufacturing process to be simple.

It should be noted that the refractive index difference between the first sub layer 3111 and the second sub layer 3112 is larger, the reflection bandwidth of the Bragg mirror is wider, and the number of layers is less, on the contrary, the refractive index difference between the first sub layer and the second sub layer is less, the reflection bandwidth of the Bragg mirror is narrower, and the number of layers is larger, so according to the refractive index difference between the first sub layer 3111 and the second sub layer 3112, a reasonable number of layers is set, that does not affect the manufacturing process of the display panel, and can obtain the highest reflection effect.

In prior art, the anode layer is a structure of a silver layer sandwiched between two indium tin oxide layers(ITO/Ag/ITO), the reflective index is more than 90%, but silver has a strong absorption in blue light band to reduce the reflective index of blue light, and silver material costs are higher. In the present application, two kinds of materials with different refractive indexes are overlapped to form a Bragg mirror, and reflected light will have a very obvious variation of peaks and valleys, so that a reflectivity index of the laminated structure is as high as 99% or more, so that the absorption of light in different wavelength bands is very low, thereby improving the refractive index, improving display quality of the display panel, and reducing costs.

A manufacturing method of the display panel 10 includes:
501, a substrate 100 is provided.
A buffer layer 110 is deposited on the substrate 100.
502, a thin film transistor layer 200 is formed on the substrate 100.
The thin film transistor layer 200 includes a first gate electrode 211, a second gate electrode 212, a source electrode 221, and a drain electrode 222.
503, a light emitting layer 300 is formed on the thin film transistor layer 200.
The light emitting layer 300 includes an anode layer anode layer 310, a light emitting portion 320, and a cathode layer 330 successively laminated and formed on the thin film transistor layer 200.

In some embodiments, the laminated structure 311 can be deposited by chemical vapor deposition to form a film, the anode layer 310 can be etched to a patterned anode by an etching solution containing phosphoric acid, nitric acid, acetic acid, and deionized water, or by a dry etching process.

The step of forming a light emitting layer 300 on the thin film transistor layer 200 includes:

5031, the anode layer 310 is formed on the thin film transistor layer 200, the anode layer 310 includes a laminated structure 311 and an electrode layer 312, the laminated structure 311 is formed on the thin film transistor layer 200, the laminated structure 311 includes at least one first sub layer 3111 and at least one second sub layer 3112, the first sub layer 3111 and the second sub layer 3112 are alternant formed on the thin film transistor layer 200, the electrode layer 312 is formed on the laminated structure 311, and the electrode layer 312 is electrically connected to the thin film transistor layer 200.

5032, a light emitting portion 320 is formed on the anode layer 310.

5033, an anode layer 310 is formed on the light emitting portion 320.

A thin film encapsulation (TFE) 400 is formed on the anode layer 310, the thin film encapsulation 400 is an inorganic layer-organic layer-inorganic layer cross-stacked film layer, which can effectively prevent the infiltration of moisture and oxygen, and ensure the normal use of the display device.

In the above, various other changes and modifications can be made by those skilled in the art in accordance with the technical solutions and technical concept of the present application, and all such changes and modifications are subject to the protection scope of the claims.

What is claimed is:

1. A display panel, comprising:
a substrate;
a thin film transistor layer, wherein the thin film transistor layer is formed on the substrate; and
a light emitting layer, wherein the light emitting layer is formed on the thin film transistor layer, the light emitting layer comprises:
an anode layer, wherein the anode layer comprises a laminated structure and an electrode layer, the laminated structure is formed on the thin film transistor layer, the laminated structure comprises at least one first sub layer and at least one second sub layer, the first sub layer and the second sub layer are alternant formed on the thin film transistor, a refractive index of the first sub layer is different from a refractive index of the second sub layer, the first sub layer and the second sub layer forms a Bragg mirror, the electrode layer is formed on the laminated structure, the electrode layer are electrically connected to the thin film transistor layer;
a light emitting portion, wherein the light emitting portion is formed on and electrically connected to the anode layer; and
a cathode layer, wherein the cathode layer is formed on and electrically connected to the light emitting portion.

2. The display panel of claim 1, wherein a material of the first sub layer is Si, SiC, $SiN_x$, $TiO_2$, $Al_2O_3$, BeO, $CaF_2$, ZnSe, $MgF_2$, LiF, MgO, or combinations thereof.

3. The display panel of claim 2, wherein a material of the second sub layer is Si, SiC, $Si_3N_4$, $SiO_x$, $TiO_2$, $Al_2O_3$, BeO, $CaF_2$, ZnSe, $MgF_2$, LiF, MgO, or combinations thereof.

4. The display panel of claim 2, wherein a material of the first sub layer is $SiN_x$, a material of the second sub layer is $SiO_x$.

5. The display panel of claim 2, wherein a thickness of the first sub layer is the same as a thickness of the second sub layer.

6. The display panel of claim 5, wherein a thickness of the first sub layer is 50-250 nm, and a thickness of the second sub layer is 50-250 nm.

7. The display panel of claim 2, wherein a thickness of the first sub layer is 50-250 nm, and a thickness of the second sub layer is 50-250 nm.

8. The display panel of claim 2, wherein a layer number of the laminated structure ranges from 1 to 20.

9. The display panel of claim 2, wherein a thickness of the laminated structure is less than 1000 nm.

10. The display panel of claim 2, wherein the display panel comprises a sub-pixel of pre-set color, the sub-pixel of pre-set color comprises the anode layer, the first sub layer has a thickness of one quarter of a wavelength of a pre-set color light, and the second sub layer has a thickness of one quarter of a wavelength of a pre-set color light.

11. A manufacturing method of a display panel, comprising:
providing a substrate;
forming a thin film transistor layer on the substrate;
forming a light emitting layer on the thin film transistor layer, wherein the light emitting layer comprises an anode layer, a light emitting portion, and a cathode layer successively laminated and formed on the thin film transistor layer, the step of forming a light emitting layer on the thin film transistor layer comprises:
forming the anode layer on the thin film transistor layer, wherein the anode layer comprises a laminated structure and an electrode layer, the laminated structure is formed on the thin film transistor layer, the laminated structure comprises at least one first sub layer and at least one second sub layer, the first sub layer and the second sub layer are alternant formed on the thin film transistor, a refractive index of the first sub layer is different from a refractive index of the second sub layer, the first sub layer and the second sub layer forms a Bragg mirror, the electrode layer is formed on the laminated structure, the electrode layer are electrically connected to the thin film transistor layer;
forming the light emitting portion on the anode layer; and
forming the cathode layer on the light emitting portion.

12. The manufacturing method of claim 11, wherein a material of the first sub layer is Si, SiC, $SiN_x$, $TiO_2$, $Al_2O_3$, BeO, $CaF_2$, ZnSe, $MgF_2$, LiF, MgO, or combinations thereof.

13. The manufacturing method of claim 12, wherein a material of the second sub layer is Si, SiC, $Si_3N_4$, $SiO_x$, $TiO_2$, $Al_2O_3$, BeO, $CaF_2$, ZnSe, $MgF_2$, LiF, MgO, or combinations thereof.

14. The manufacturing method of claim 12, wherein a material of the first sub layer is $SiN_x$, a material of the second sub layer is $SiO_x$.

15. The manufacturing method of claim 12, wherein a thickness of the first sub layer is the same as a thickness of the second sub layer.

16. The manufacturing method of claim 15, wherein a thickness of the first sub layer is 50-250 nm, and a thickness of the second sub layer is 50-250 nm.

17. The manufacturing method of claim 12, wherein a thickness of the first sub layer is 50-250 nm, and a thickness of the second sub layer is 50-250 nm.

18. The manufacturing method of claim 12, wherein a layer number of the laminated structure ranges from 1 to 20.

19. The manufacturing method of claim 12, wherein a thickness of the laminated structure is less than 1000 nm.

20. The manufacturing method of claim 12, wherein the display panel comprises a sub-pixel of pre-set color, the sub-pixel of pre-set color comprises the anode layer, the first sub layer has a thickness of one quarter of a wavelength of a pre-set color light, and the second sub layer has a thickness of one quarter of a wavelength of a pre-set color light.

* * * * *